(12) United States Patent
Murase (10) Patent No.: US 11,923,885 B2
(45) Date of Patent: *Mar. 5, 2024

(54) HIGH-FREQUENCY MODULE AND COMMUNICATION APPARATUS

(71) Applicant: Murata Manufacturing Co., Ltd., Kyoto (JP)

(72) Inventor: Hisanori Murase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 302 days.

This patent is subject to a terminal disclaimer.

(21) Appl. No.: 17/381,348

(22) Filed: Jul. 21, 2021

(65) Prior Publication Data

US 2021/0351802 A1 Nov. 11, 2021

Related U.S. Application Data

(63) Continuation of application No. PCT/JP2020/007438, filed on Feb. 25, 2020.

(30) Foreign Application Priority Data

Mar. 1, 2019 (JP) ................................. 2019-037227

(51) Int. Cl.
*H04B 1/38* (2015.01)
*H01Q 1/22* (2006.01)
*H03H 7/38* (2006.01)
*H04B 1/16* (2006.01)

(52) U.S. Cl.
CPC ............. *H04B 1/38* (2013.01); *H01Q 1/2283* (2013.01); *H03H 7/38* (2013.01); *H04B 1/1615* (2013.01)

(58) Field of Classification Search
CPC .......... H04B 1/38; H04B 1/1615; H04B 1/48; H03H 7/38; H03H 7/48; H01Q 1/2283
USPC ................................. 375/219–222, 257, 295
See application file for complete search history.

(56) References Cited

U.S. PATENT DOCUMENTS

| | | | |
|---|---|---|---|
| 9,136,817 B2* | 9/2015 | Tsutsumi | H03H 9/70 |
| 2005/0093171 A1 | 5/2005 | Sugiura | |
| 2005/0104685 A1 | 5/2005 | Kuroki et al. | |
| 2007/0058748 A1* | 3/2007 | Kim | H04B 1/52 |
| | | | 375/295 |
| 2010/0157860 A1* | 6/2010 | Hagiwara | H04B 1/48 |
| | | | 370/310 |

(Continued)

FOREIGN PATENT DOCUMENTS

| JP | 2005-057577 A | 3/2005 |
|---|---|---|
| JP | 2005-123909 A | 5/2005 |

(Continued)

OTHER PUBLICATIONS

International Search Report for PCT/JP2020/007438 dated Apr. 7, 2020.
Written Opinion for PCT/JP2020/007438 dated Apr. 7, 2020.

*Primary Examiner* — Emmanuel Bayard
(74) *Attorney, Agent, or Firm* — Pearne & Gordon LLP (57) ABSTRACT

A high-frequency module (1) includes a mounting substrate (90), a transmission filter (6MT) arranged on the mounting substrate (90), a reception filter (6MR) arranged on the mounting substrate (90), and a semiconductor control IC (40) arranged on the mounting substrate (90) and stacked with the reception filter (6MR) of the transmission filter (6MT) and the reception filter (6MR).

14 Claims, 7 Drawing Sheets

(56) References Cited

U.S. PATENT DOCUMENTS

| | | | |
|---|---|---|---|
| 2014/0027906 A1 | 1/2014 | Narita et al. | |
| 2017/0077896 A1* | 3/2017 | Sugaya | H03H 7/0138 |
| 2017/0141066 A1 | 5/2017 | Toyota | |
| 2017/0288614 A1 | 10/2017 | Obiya et al. | |
| 2018/0190601 A1 | 7/2018 | Hitomi et al. | |
| 2019/0267339 A1 | 8/2019 | Murase | |
| 2020/0077510 A1* | 3/2020 | Darveaux | H05K 1/113 |
| 2021/0359661 A1* | 11/2021 | Murase | H03F 3/245 |

FOREIGN PATENT DOCUMENTS

| | | | |
|---|---|---|---|
| JP | 2014-027109 A | 2/2014 | |
| JP | 2017-098300 A | 6/2017 | |
| JP | 2017-184060 A | 10/2017 | |
| WO | WO-2016136413 A1 * | 9/2016 | H03H 7/0138 |
| WO | 2017/033564 A1 | 3/2017 | |
| WO | 2018/110513 A1 | 6/2018 | |

* cited by examiner

HIGH-FREQUENCY MODULE AND COMMUNICATION APPARATUS

CROSS REFERENCE TO RELATED APPLICATION

This is a continuation of International Application No. PCT/JP2020/007438 filed on Feb. 25, 2020 which claims priority from Japanese Patent Application No. 2019-037227 filed on Mar. 1, 2019. The contents of these applications are incorporated herein by reference in their entireties.

BACKGROUND

Technical Field

The present disclosure relates to a high-frequency module and a communication apparatus.

In mobile communication apparatuses, such as mobile phones, in particular, the number of circuit elements configuring a high-frequency front-end circuit increases with the progress in multi-band use.

Patent Document 1 discloses a surface acoustic wave device (high-frequency module) having a configuration in which a SAW device (high-frequency filter) and a semiconductor integrated circuit (semiconductor IC) are stacked in order to cope with the miniaturization of a high-frequency front-end circuit.

Patent Document 1: Japanese Unexamined Patent Application Publication No. 2005-57577

BRIEF SUMMARY

However, in the surface acoustic wave device (high-frequency module) disclosed in Patent Document 1, since the SAW device (high-frequency filter) and the semiconductor integrated circuit (semiconductor IC) are stacked, control characteristics of a control circuit included in the semiconductor integrated circuit (semiconductor IC) may deteriorate due to high-frequency noise oscillated from the high-frequency filter.

The present disclosure provides a high-frequency module and a communication apparatus in which deterioration of control characteristics of a semiconductor control IC is suppressed.

A high-frequency module according to an aspect of the present disclosure includes a mounting substrate, a transmission filter arranged on the mounting substrate, a first reception filter arranged on the mounting substrate, and a semiconductor control IC arranged on the mounting substrate and stacked with the first reception filter of the transmission filter and the first reception filter.

According to the present disclosure, it is possible to provide a high-frequency module and a communication apparatus in which deterioration of the control characteristics of a semiconductor control IC is suppressed.

DETAILED DESCRIPTION

Hereinafter, an embodiment of the present disclosure and modifications thereof will be described in detail with reference to the drawings. It should be noted that the embodiment described below and the modifications thereof are all inclusive or specific examples. The numerical values, shapes, materials, constituent elements, arrangement and connection forms of the constituent elements, and the like in the following embodiment and modifications thereof are mere examples, and are not intended to limit the present disclosure. Among the constituent elements in the following embodiment and modifications thereof, constituent elements not recited in the independent claims are described as arbitrary constituent elements. In addition, the size or a ratio of the size of the constituent elements illustrated in the drawings is not necessarily strict.

In the following embodiment and modifications thereof, in A, B, and C mounted on a substrate, the expression "in a case where the substrate (or a main surface of the substrate) is viewed in a plan view, C is arranged between A and B" is defined to mean that a line connecting an arbitrary point in a region of A projected when the substrate is viewed in a plan view and an arbitrary point in a region of B projected when the substrate is viewed in a plan view is overlapped with at least a part of a region of C projected when the substrate is viewed in a plan view.

In addition, in the present specification, terms (e.g., "perpendicular", "parallel", and the like) that indicate relations between elements, terms that indicate the shapes of elements, and numerical ranges are not expressions that represent only strict meanings, but are expressions that are meant to include a substantially equivalent range, for example, even a difference of small percent.

In the following embodiment and modifications thereof, "A and B are connected" is defined to include not only a fact that A and B are in contact with each other, but also a fact that the connection A and B are electrically connected to each other via conductor wiring.

Embodiment

[1 Circuit Configuration of High-Frequency Module 1 and Communication Apparatus 5]

Figure 1:
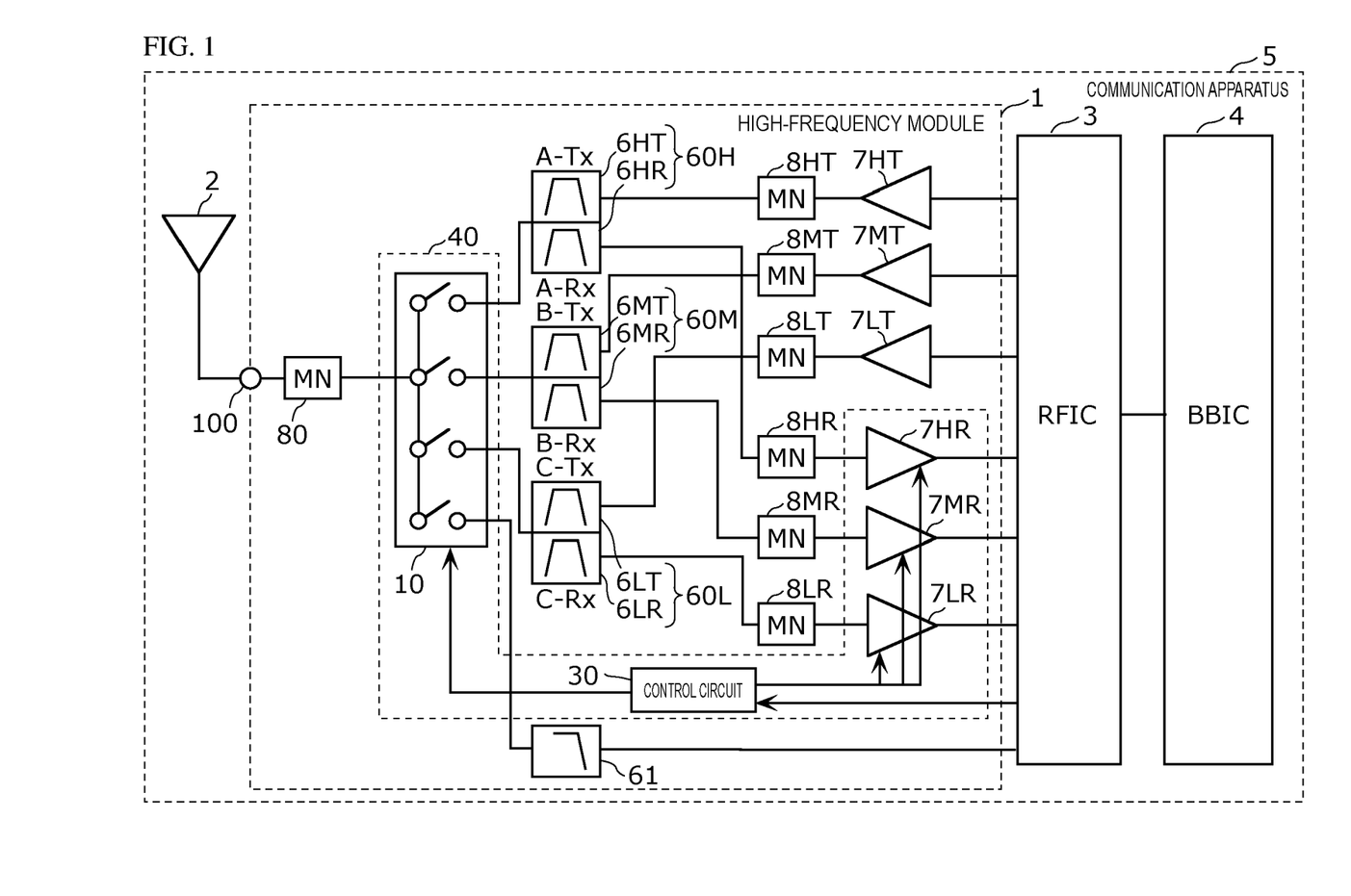
FIG. 1 is a circuit configuration diagram of a high-frequency module and a communication apparatus according to an embodiment.

FIG. 1 is a circuit configuration diagram of a high-frequency module 1 and a communication apparatus 5 according to an embodiment. As illustrated in this figure, the communication apparatus 5 includes the high-frequency module 1, an antenna 2, an RF signal processing circuit (RFIC) 3, and a baseband signal processing circuit (BBIC) 4.

The RFIC 3 is an RF signal processing circuit that processes a high-frequency signal transmitted and received by the antenna 2. Specifically, the RFIC 3 performs signal processing on the high-frequency signal inputted through a reception signal path of the high-frequency module 1 by down-conversion or the like, and outputs the reception signal generated by the signal processing to the BBIC 4. Further, the RFIC 3 performs signal processing on a transmission signal inputted from the BBIC 4 by up-conversion or the like, and outputs the high-frequency signal generated by the signal processing to a transmission signal path of the high-frequency module 1.

The BBIC 4 is a circuit that performs signal processing using an intermediate frequency band having a lower frequency than a high-frequency signal transmitted through the high-frequency module 1. The signal processed in BBIC 4 is used, for example, as an image signal for image display, or used as an audio signal for a phone call via a speaker.

Further, the RFIC 3 has a function of controlling an inter-terminal connection of a switch 10 included in the high-frequency module 1 and a function of controlling gains of low-noise amplifiers (LNA) 7HR, 7MR, and 7LR included in the high-frequency module 1, on the basis of a communication band (frequency band) to be used. Specifically, the RFIC 3 outputs a power supply signal, an IO signal, a clock signal, a data signal, and the like to a control circuit 30 included in the high-frequency module 1. Based on these signals, the control circuit 30 outputs a control signal to the switch 10, and the low-noise amplifiers 7HR, 7MR, and 7LR.

The antenna 2 is connected to a transmission/reception terminal 100 of the high-frequency module 1, radiates a high-frequency signal output from the high-frequency module 1, and receives a high-frequency signal from the outside and outputs the high-frequency signal to the high-frequency module 1.

In the communication apparatus 5 according to the present embodiment, the antenna 2 and the BBIC 4 are optional components.

Next, the detailed configuration of the high-frequency module 1 will be described.

As illustrated in FIG. 1, the high-frequency module 1 includes a transmission/reception terminal 100, duplexers 60H, 60M, and 60L, an LC filter 61, a semiconductor control IC (Integrated Circuit) 40, matching circuits 8HT, 8MT, 8LT, 8HR, 8MR, 8LR, and 80, and power amplifiers (PA: Power Amplifier) 7HT, 7MT, and 7LT.

The duplexer 60H is formed of a transmission filter 6HT and a reception filter 6HR. The transmission filter 6HT is applied to a communication system according to the Third Generation Partnership Project (3GPP) standard, and for example, allows a high-frequency signal in a transmission band of a communication band A in Long Term Evolution (LTE) or 5th Generation New Radio (5GNR) to pass therethrough. The reception filter 6HR is applied to a communication system according to the 3GPP standard, and for example, allows a high-frequency signal in a reception band of the communication band A in LTE or 5GNR to pass therethrough.

The duplexer 60M is made of a transmission filter 6MT and a reception filter 6MR. The transmission filter 6MT is applied to a communication system according to the 3GPP standard, and for example, allows a high-frequency signal in a transmission band of a communication band B in LTE or 5GNR to pass therethrough. The reception filter 6MR is applied to a communications system according to the 3GPP standard, and for example, allows the high-frequency signal in a reception band of the communication band B in LTE or 5GNR to pass therethrough.

The duplexer 60L is made of a transmission filter 6LT and a reception filter 6LR. The transmission filter 6LT is applied to a communication system according to the 3GPP standard, and for example, allows a high-frequency signal in a transmission band of a communication band C in LTE or 5GNR to pass therethrough. The reception filter 6LR is applied to a communications system according to the 3GPP standard, and for example, allows a high-frequency signal in a reception band of the communication band C in LTE or 5GNR to pass therethrough.

Here, the communication band A has a higher frequency than that of the communication band B, and the communication band B has a higher frequency than that of the communication band C.

In the present embodiment, in two filters arbitrarily extracted out of the reception filters 6HR, 6MR, and 6LR that configure the duplexers 60H, 60M, and 60L, a reception filter having a pass band with a relatively low frequency is defined as a first reception filter, and a reception filter having a pass band with a relatively high frequency is defined as a second reception filter. Further, of the three reception filters 6HR, 6MR, and 6LR, the reception filter 6HR having a pass band with the highest frequency is defined as a second reception filter, and the two reception filters 6MR and 6LR having a pass band with a lower frequency than the second reception filter are defined as a first reception filter and a third reception filter, respectively.

The transmission filters 6HT, 6MT, and 6LT, and the reception filters 6HR, 6MR, and 6LR may be any one of, for example, a surface acoustic wave filter, an acoustic wave filter using a bulk acoustic wave (BAW), an LC resonant filter, and a dielectric filter, and further, they are not limited thereto.

The LC filter 61 is, for example, a low-pass filter circuit, and is composed of an inductor and a capacitor. The LC filter 61 allows, for example, a high-frequency signal in a transmission/reception band of a 2nd Generation (2G) communication band to pass therethrough.

A semiconductor control IC 40 includes the switch 10, the low-noise amplifiers 7HR, 7MR, and 7LR, and the control circuit 30.

The switch 10 has a common terminal and a plurality of selection terminals, and switches connection and disconnection between the common terminal and each selection terminal. The common terminal of the switch 10 is connected to the transmission/reception terminal 100 via a matching circuit 80. The plurality of selection terminals of the switch 10 is connected to the common terminal of the duplexer 60H, the common terminal of the duplexer 60M, the common terminal of the duplexer 60L, and one terminal of the LC filter 61, respectively.

The low-noise amplifiers 7HR, 7MR, and 7LR, each includes an amplification element, such as a bipolar transistor or a field effect transistor.

An input terminal of the low-noise amplifier 7HR is connected to an output terminal of the reception filter 6HR via the matching circuit 8HR, and an output terminal of the low-noise amplifier 7HR is connected to the RFIC 3. The low-noise amplifier 7HR preferentially amplifies the high-frequency signal in the communication band A, for example, with low noise.

An input terminal of the low-noise amplifier 7MR is connected to an output terminal of the reception filter 6MR via the matching circuit 8MR, and an output terminal of the low-noise amplifier 7MR is connected to the RFIC 3. The low-noise amplifier 7MR preferentially amplifies the high-frequency signal in the communication band B, for example, with low noise.

An input terminal of the low-noise amplifier 7LR is connected to an output terminal of the reception filter 6LR via the matching circuit 8LR, and an output terminal of the low-noise amplifier 7LR is connected to the RFIC 3. The low-noise amplifier 7LR preferentially amplifies the high-frequency signal in the communication band C with low noise, for example.

The low-noise amplifiers 7HR, 7MR, and 7LR may be collected on one amplification circuit. In this case, the amplification circuit preferentially amplifies the high-frequency signals in the communication bands A, B, and C with low noise, and a switch that switches connection and disconnection between the reception filters 6HR, 6MR, and 6LR and the input terminal of the amplification circuit is arranged on the side of an input terminal of the amplification circuit.

The semiconductor control IC 40 is made of, for example, a complementary metal oxide semiconductor (CMOS). This makes it possible to manufacture the semiconductor control IC 40 at low cost. The semiconductor control IC 40 may be made of GaAs. This makes it possible to output a high-frequency signal having high-quality amplification performance and noise performance.

Further, the switch 10 and the low-noise amplifiers 7HR, 7MR, and 7LR may not be included in the semiconductor control IC 40. The switch 10 may be arranged individually, for example, as a component separate from the semiconductor control IC 40. Further, the low-noise amplifiers 7HR, 7MR, and 7LR may be arranged individually, for example, as an amplification circuit separate from the semiconductor control IC 40.

The power amplifiers 7HT, 7MT, and 7LT, each includes an amplification element, such as a bipolar transistor or a field effect transistor. The power amplifiers 7HT, 7MT, and 7LT are configured of, for example, a CMOS or a field-effect transistor (FET) made of GaAs, a heterojunction bipolar transistor (HBT), or the like.

An input terminal of the power amplifier 7HT is connected to the RFIC 3. An output terminal of the power amplifier 7HT is connected to an input terminal of the transmission filter 6HT via the matching circuit 8HT. The power amplifier 7HT preferentially amplifies the high-frequency signal in the communication band A, for example.

An input terminal of the power amplifier 7MT is connected to the RFIC 3. An output terminal of the power amplifier 7MT is connected to an input terminal of the transmission filter 6MT via the matching circuit 8MT. The power amplifier 7MT preferentially amplifies the high-frequency signal in the communication band B, for example.

An input terminal of the power amplifier 7LT is connected to the RFIC 3. An output terminal of the power amplifier 7LT is connected to an input terminal of the transmission filter 6LT via the matching circuit 8LT. The power amplifier 7LT preferentially amplifies the high-frequency signal in the communication band C, for example.

The power amplifiers 7HT, 7MT, and 7LT may be collected on one amplification circuit. In this case, the amplification circuit preferentially amplifies the high-frequency signals in the communication bands A, B, and C, and a switch that switches connection and disconnection between the transmission filters 6HT, 6MT, and 6LT and an output terminal of the amplification circuit is arranged on the side of the output terminal of the amplification circuit.

Further, the semiconductor control IC 40 may further include the power amplifiers 7HT, 7MT, and 7LT and an amplification control circuit for controlling gains of these power amplifiers.

The semiconductor control IC 40 may include at least one of: (1) the switch 10 and a switch control circuit that controls switching of the switch 10; and (2) an amplifier that amplifies a high-frequency signal and an amplification control circuit that controls a gain of the amplifier.

The matching circuit 8HT is arranged in a path connecting the power amplifier 7HT and the transmission filter 6HT, and matches an output impedance of the power amplifier 7HT with an input impedance of the transmission filter 6HT. The matching circuit 8MT is arranged in a path connecting the power amplifier 7MT and the transmission filter 6MT, and matches an output impedance of the power amplifier 7MT with an input impedance of the transmission filter 6MT. The matching circuit 8LT is arranged in a path connecting the power amplifier 7LT and the transmission filter 6LT, and matches an output impedance of the power amplifier 7LT with an input impedance of the transmission filter 6LT. Each of the matching circuits 8HT, 8MT, and 8LT includes at least one of an inductor and a capacitor.

The matching circuit 8HR is arranged in a path connecting the low-noise amplifier 7HR and the reception filter 6HR, and matches an input impedance of the low-noise amplifier 7HR with an output impedance of the reception filter 6HR. The matching circuit 8MR is arranged in a path connecting the low-noise amplifier 7MR and the reception filter 6MR, and matches an input impedance of the low-noise amplifier 7MR with an output impedance of the reception filter 6MR. The matching circuit 8LR is arranged in a path connecting the low-noise amplifier 7LR and the reception filter 6LR, and matches an input impedance of the low-noise amplifier 7LR with an output impedance of the reception filter 6LR. Each of the matching circuits 8HR, 8MR, and 8LR includes at least one of an inductor and a capacitor.

The matching circuit 80 is arranged in a path connecting the switch 10 and the transmission/reception terminal 100, and establishes impedance matching between the switches 10, the duplexers 60H, 60M, and 60L and the antenna 2. The matching circuit 80 includes at least one of an inductor and a capacitor.

According to the above-described circuit configuration of the high-frequency module 1, it is possible to perform any one of transmission and reception of a high-frequency signal in the communication band A, transmission and reception of a high-frequency signal in the communication band B, transmission and reception of a high-frequency signal in the communication band C, and transmission and reception of a high-frequency signal of 2G. Further, according to the above-described circuit configuration, two or more of the transmission and reception of the high-frequency signal in the communication band A, the transmission and reception of the high-frequency signal in the communication band B, the transmission and reception of the high-frequency signal in the communication band C, and the transmission and reception of the high-frequency signal of 2G can be performed at the same time.

The high-frequency module according to the present disclosure only needs to include at least one of the duplexers 60H, 60M, and 60L, and the semiconductor control IC 40, among the components of the high-frequency module 1 according to the embodiment. Alternatively, the high-frequency module according to the present disclosure only needs to include at least one of the transmission filters 6HT, 6MT, and 6LT, at least one of the reception filters 6HR, 6MR, and 6LR, and the semiconductor control IC 40. Accordingly, the duplexers 60H, 60M, and 60L may be a single filter having the communication band A as a pass band, a single filter having the communication band B as a pass band, and a single filter having the communication band C as a pass band, respectively.

Therefore, the number of communication bands in which the high-frequency module according to the present disclosure can perform transmission only needs to be 1 or more, and the presence or absence of simultaneous transmission of transmission signals and reception signals in the same communication band and the presence or absence of simultaneous transmission of signals between different communication bands are also optional.

Here, in a case where the circuit elements (and components) that configure the high-frequency module 1 are made by one module as a compact front-end circuit, a mounting area on the mounting substrate may be reduced by stacking the circuit elements with each other. However, for example, when the duplexers 60H, 60M, and 60L and the semiconductor control IC 40 are stacked, the control characteristics of the semiconductor control IC 40 may deteriorate due to a high-frequency noise oscillated from the duplexers 60H, 60M, and 60L.

On the other hand, since a transmission signal having a large signal strength is likely to be a noise signal, the high-frequency module 1 according to the present embodiment has a configuration in which a stack of a transmission filter for processing a transmission signal having a relatively large signal strength and the semiconductor control IC 40 is excluded. Hereinafter, a configuration in which the deterioration of the control characteristics of the semiconductor control IC is suppressed while reducing the size of the high-frequency module 1 will be described.

[2 Circuit Element Arrangement Configuration of High-Frequency Module 1]

Figure 2A:
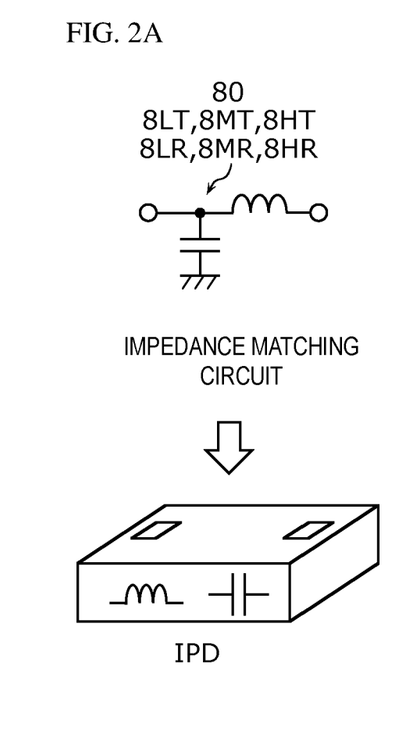
FIGS. 2A-2C include schematic diagrams illustrating a configuration of an integrated passive element and a semiconductor control IC according to the embodiment.
Figure 2B:
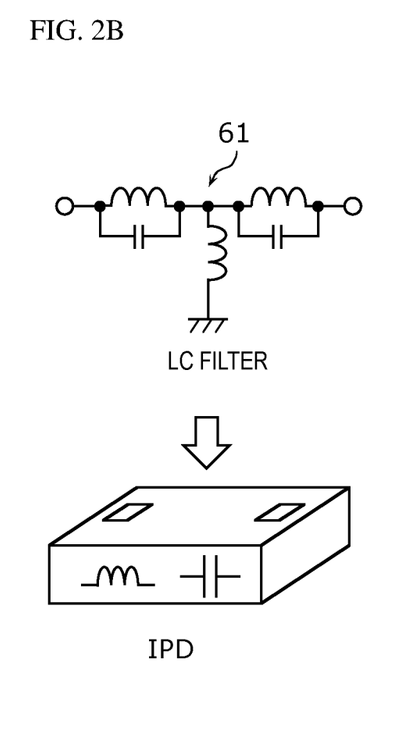
Figure 2C:
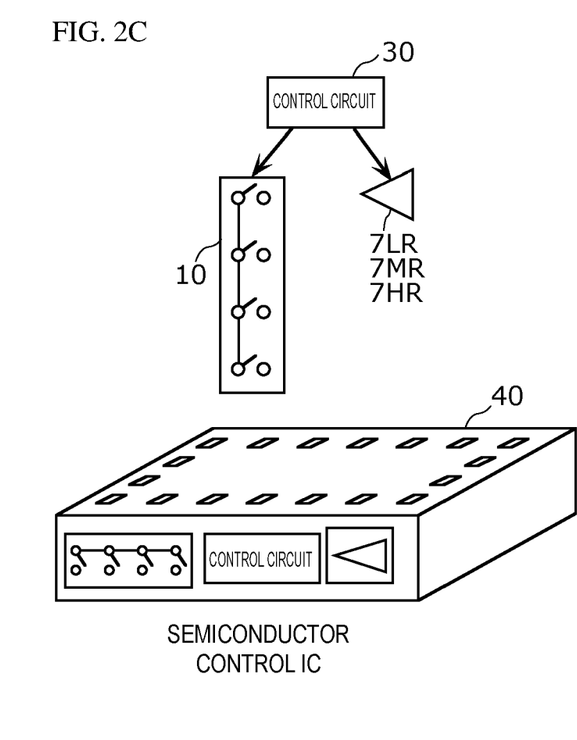

FIGS. 2A-2C include schematic diagrams illustrating the configuration of an integrated passive element (IPD) and the semiconductor control IC 40 according to the embodiment.

As illustrated in FIG. 2C, in the semiconductor control IC 40 according to the present embodiment, the switch 10, the low-noise amplifiers 7HR, 7MR, and 7LR, and the control circuit 30 are formed into one chip (one package).

Further, as illustrated in FIG. 2A, each of the matching circuits 8HT, 8MT, 8LT, 8HR, 8MR, 8LR, and 80 according to the present embodiment is a first integrated passive element (first IPD) having a configuration in which passive elements, such as an inductor and a capacitor are integrally mounted inside or on a surface of the substrate. The substrate configuring the first integrated passive element (first IPD) is, for example, a Si substrate. The first integrated passive element (first IPD) is formed into one chip.

Further, as illustrated in FIG. 2B, the LC filter 61 according to the present embodiment is a second integrated passive element (second IPD) having a configuration in which passive elements, such as an inductor and a capacitor are integrally mounted inside or the surface of the substrate. The substrate configuring the second integrated passive element (second IPD) is, for example, a Si substrate. The second integrated passive element (second IPD) is formed into one chip.

Figure 3:
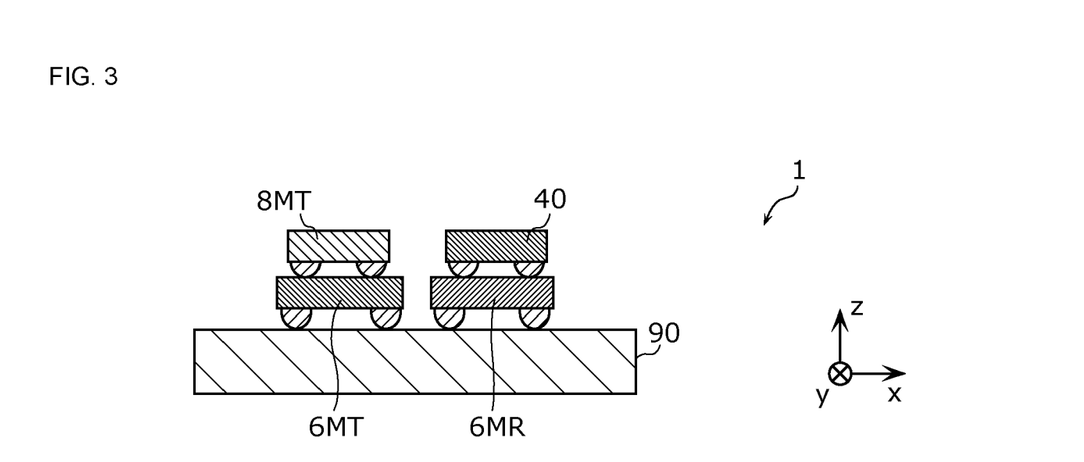
FIG. 3 is a schematic cross-sectional view of the high-frequency module according to the embodiment.

FIG. 3 is a schematic cross-sectional view of the high-frequency module 1 according to the embodiment. As illustrated in this figure, the high-frequency module 1 according to the present embodiment further includes a mounting substrate 90 in addition to the circuit configuration illustrated in FIG. 1. FIG. 3 illustrates the transmission filter 6MT, the reception filter 6MR, the matching circuit 8MT, and the semiconductor control IC 40 in the circuit configuration illustrated in FIG. 1.

The mounting substrate 90 is a substrate on which a circuit element and a component configuring the high-frequency module 1 are mounted. As the mounting substrate 90, for example, a low-temperature co-fired ceramics (LTCC) substrate having a laminated structure of a plurality of dielectric layers, a printed circuit board, or the like is used.

As illustrated in FIG. 3, the reception filter 6MR and the semiconductor control IC 40 are stacked in a direction (z-axis direction) perpendicular to a main surface of the mounting substrate 90. Further, the transmission filter 6MT and the matching circuit 8MT are stacked in a direction (z-axis direction) perpendicular to the main surface of the mounting substrate 90.

That is, in the high-frequency module 1 according to the present embodiment, the semiconductor control IC 40 is stacked with the reception filter 6MR (first reception filter) out of the transmission filter 6MT for transmitting a transmission signal and the reception filter 6MR for transmitting a reception signal. In other words, the semiconductor control IC 40 is not stacked with the transmission filter 6MT for transmitting the transmission signal, and is stacked with the reception filter 6MR (first reception filter) for transmitting the reception signal.

The semiconductor control IC 40 may be stacked with any one of the reception filters 6HR and 6LR instead of being stacked with the reception filter 6MR.

When the high-frequency filter and the semiconductor control IC 40 are stacked, it is assumed that the control signal of the semiconductor control IC 40 is affected by the high-frequency noise oscillated from the high-frequency filter, and switching performance of the switch and amplification performance of the amplifier may be reduced. In contrast, in the high-frequency module 1 according to the present embodiment, the semiconductor control IC 40 is stacked with the reception filter out of the transmission filter for transmitting a transmission signal having a larger signal strength than a reception signal and the reception filter for transmitting the reception signal having a smaller signal strength than the transmission signal. In other words, the semiconductor control IC 40 is not stacked with the transmission filter, but is stacked with the reception filter. According to this configuration, the semiconductor control IC 40 is not stacked with a transmission filter for transmitting a transmission signal that is likely to be a noise signal (a signal strength is large), and is stacked with a reception filter that transmits a reception signal having a relatively small signal strength. Therefore, it is possible to suppress the deterioration of the control characteristics of the semiconductor control IC 40 while reducing the size of the high-frequency module 1.

As illustrated in FIG. 3, it is desirable that the reception filter 6MR and the semiconductor control IC 40 be stacked in the order of the reception filter 6MR and the semiconductor control IC 40 from the main surface of the mounting substrate 90.

According to the above configuration, since the high-frequency signal passing through the reception filter 6MR is transmitted through the mounting substrate 90, it is possible to suppress propagation of the high-frequency signal to the semiconductor control IC 40 that is arranged on the side opposite to the mounting substrate 90 with respect to the reception filter 6MR. Therefore, it is possible to further suppress the deterioration of the control characteristics of the semiconductor control IC 40.

In the high-frequency module 1 according to the present embodiment, in realizing the stacked structure illustrated in FIG. 3, the reception filter 6MR and the transmission filter 6MT each are connected, via a bump electrode formed on lower surfaces thereof (surfaces on a negative side in the z-axis direction), to the mounting substrate 90. In addition, the semiconductor control IC 40 is connected to the reception filter 6MR via a bump electrode formed on a lower surface (a surface on the negative side in the z-axis direction) of the semiconductor control IC 40. Further, the matching circuit 8MT is connected to the transmission filter 6MT via a bump electrode formed on a lower surface (a surface on the negative side in the z-axis direction) of the matching circuit 8MT.

The bump electrode is a ball-shaped electrode made of a high-conductivity metal, and examples thereof include a solder bump made of Sn/Ag/Cu, a bump containing Au as a main component, and the like. Alternatively, instead of the bump electrode, an electrode formed of, for example, a solder paste may be used.

In the present specification, in the components, such as the transmission filter, the reception filter, the matching circuit, and the semiconductor control IC, among main surfaces thereof facing each other across a main body thereof, the main surface that is close to the mounting substrate 90 is described as a lower surface, and the main surface that is far from the mounting substrate 90 is described as an upper surface.

In addition, the semiconductor control IC 40 and the matching circuit 8MT are each configured to transmit and receive, from the lower surfaces thereof, an electric signal to and from the reception filter 6MR, the transmission filter 6MT, and the mounting substrate 90, and be mechanically bonded to the reception filter 6MR and the transmission filter 6MT on the lower surfaces thereof, but the present disclosure is not limited thereto. The semiconductor control IC 40 and the matching circuit 8MT may be each configured to be mechanically bonded, on the lower surfaces thereof, to the duplexer via solder, an adhesive, or the like, and an electrode provided on upper surfaces thereof and an electrode provided on the main surface of the mounting substrate 90 may be connected by a bonding wire.

Further, in the high-frequency module 1 according to the present embodiment, the matching circuit 8MT is stacked with the transmission filter 6MT from among the transmission filter 6MT for transmitting a transmission signal having a larger signal strength than a reception signal and the reception filter 6MR for transmitting the reception signal having a smaller signal strength than the transmission signal.

According to the above configuration, the integrated passive element that is less affected by the high-frequency noise signal oscillated from the high-frequency filter than the semiconductor control IC 40 is stacked with the transmission filter 6MT. Therefore, it is possible to suppress the deterioration of the control characteristics of the semiconductor control IC 40 while reducing the size of the high-frequency module 1.

The integrated passive elements to be stacked with the transmission filter 6MT may be at least one of the matching circuits 8HT, 8MT, 8LT, 8HR, 8MR, 8LR, and 80, and the LC filter 61 illustrated in FIG. 1.

Further, it is desirable that the integrated passive elements stacked with the transmission filter 6MT be at least one of the matching circuits 8HT, 8MT, 8LT, 8HR, 8MR, 8LR, and 80 (first integrated passive element) from among the matching circuits 8HT, 8MT, 8LT, 8HR, 8MR, 8LR, and 80 (which are the first integrated passive elements), and the LC filter 61 (second integrated passive element).

According to the above configuration, of the matching circuits 8HT, 8MT, 8LT, 8HR, 8MR, 8LR, and 80 (which are the first integrated passive elements), and the LC filter 61 (second integrated passive element), the matching circuits 8HT, 8MT, 8LT, 8HR, 8MR, 8LR, and 80 (which are the first integrated passive elements), which are less affected by the high-frequency noise signal oscillated from the high-frequency filters, are stacked with the transmission filter 6MT. Therefore, it is possible to suppress the deterioration of the control characteristics of the semiconductor control IC 40 while reducing the size of the high-frequency module 1.

Further, although not illustrated in FIG. 3, it is desirable that the LC filter 61 (second integrated passive element) be stacked with the reception filter from among the transmission filter for transmitting a transmission signal having a larger signal strength than a reception signal and the reception filter for transmitting the reception signal having a smaller signal strength than the transmission signal.

According to the above configuration, of the matching circuits 8HT, 8MT, 8LT, 8HR, 8MR, 8LR, and 80 (which are the first integrated passive elements), and the LC filter 61 (second integrated passive element), the LC filter 61, which is likely to be affected by the high-frequency noise signal oscillated from the high-frequency filter, is stacked with the reception filter instead of the transmission filter. Therefore, it is possible to suppress the deterioration of bandpass characteristic of the LC filter 61.

[3 Circuit Element Arrangement Configuration of High-Frequency Module 1A]

Figure 4:
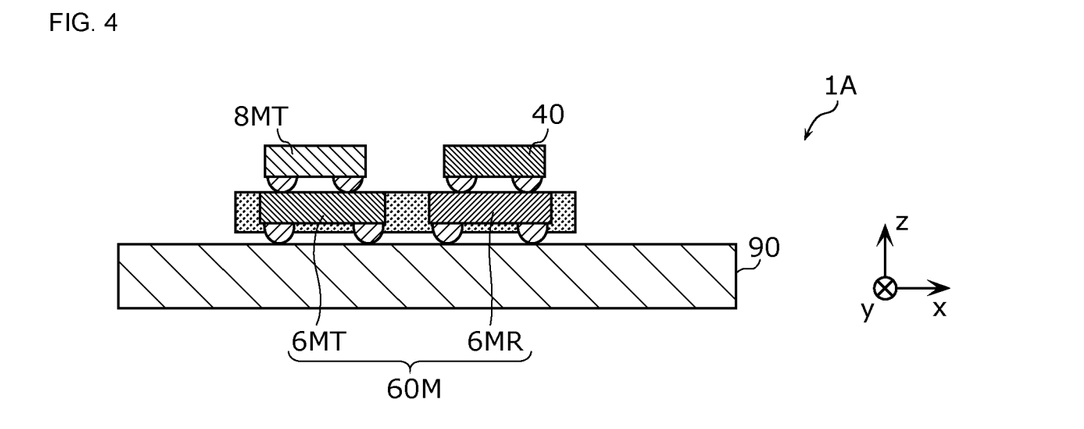
FIG. 4 is a schematic cross-sectional view of a high-frequency module according to Modification 1 of the embodiment.

FIG. 4 is a schematic cross-sectional view of a high-frequency module 1A according to Modification 1 of the embodiment. The arrangement configuration of the transmission filter, the reception filter, the semiconductor control IC, and the matching circuit of the high-frequency module 1A illustrated in this figure differs from the high-frequency module 1 according to the embodiment. Hereinafter, a description of the same configuration of the high-frequency module 1A as that of the high-frequency module 1 according to the embodiment will be omitted, and different configurations will be mainly described.

As illustrated in FIG. 4, the transmission filter 6MT and the reception filter 6MR are integrated to configure the duplexer 60M. The duplexer 60M has a configuration in which the transmission filter 6MT and the reception filter 6MR are formed into one chip, or a configuration in which the transmission filter 6MT and the reception filter 6MR are incorporated in one package.

In addition, as illustrated in FIG. 4, the semiconductor control IC 40 and the matching circuit 8MT are arranged above the duplexer 60M (in a z-axis positive direction). The semiconductor control IC 40 and the reception filter 6MR are stacked in a direction (z-axis direction) perpendicular to the main surface of the mounting substrate 90. Further, the matching circuit 8MT and the transmission filter 6MT are stacked in a direction (z-axis direction) perpendicular to the main surface of the mounting substrate 90.

In the high-frequency module 1A according to the present modification, in realizing the stacked structure illustrated in FIG. 4, the duplexer 60M is connected, via a bump electrode formed on a lower surface thereof, to the mounting substrate 90. Further, the semiconductor control IC 40 is connected, via a bump electrode formed on the lower surface thereof, to the reception filter 6MR. In addition, the matching circuit 8MT is connected, via a bump electrode formed on the lower surface thereof, to the transmission filter 6MT. Instead of the bump electrode, an electrode formed of, for example, a solder paste may be used.

Further, the semiconductor control IC 40 and the matching circuit 8MT are each configured to exchange, from the lower surfaces thereof, an electric signal with the duplexer 60M and the mounting substrate 90, and be mechanically bonded to the duplexer 60M on the lower surfaces thereof, but the present disclosure is not limited thereto. The semiconductor control IC 40 and the matching circuit 8MT may be each configured to be mechanically bonded, on the lower surfaces thereof, to a duplexer via solder, an adhesive, or the like; and an electrode provided on the upper surfaces thereof and the main surface of the mounting substrate 90 may be connected by a bonding wire.

In the high-frequency module 1A according to the present modification, the semiconductor control IC 40 only needs to be stacked with at least one of the reception filters 6HR, 6MR, and 6LR; and at least one of the matching circuits 8HT, 8MT, 8LT, 8HR, 8MR, 8LR, and 80, and the LC filter 61 only needs to be stacked with the transmission filter 6MT.

According to the above-described configuration, the semiconductor control IC 40 is not stacked with the transmission filter, of the duplexer 60M, for transmitting a transmission signal having a larger signal strength than a reception signal, and is stacked with the reception filter for transmitting the reception signal having a smaller signal strength than the transmission signal. In addition, the matching circuit or the LC filter formed of the integrated passive element is stacked with the transmission filter. Therefore, it is possible to suppress the deterioration of the control characteristics of the semiconductor control IC 40 while reducing the size of the high-frequency module 1A.

[4 Circuit Element Arrangement Configuration of High-Frequency Module 1B]

Figure 5:
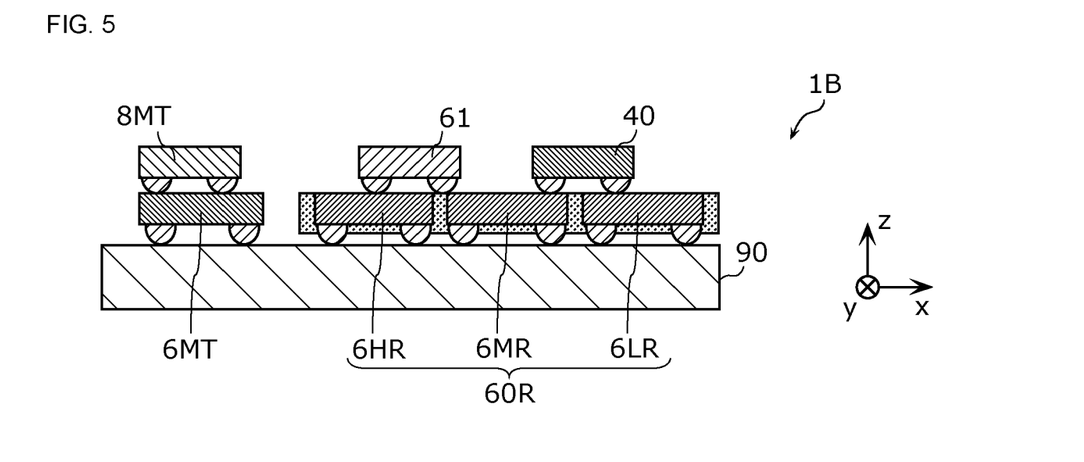
FIG. 5 is a schematic cross-sectional view of a high-frequency module according to Modification 2 of the embodiment.

FIG. 5 is a schematic cross-sectional view of a high-frequency module 1B according to Modification 2 of the embodiment. The arrangement configuration of the transmission filter, the reception filter, the semiconductor control IC, the matching circuit, and the LC filter of the high-frequency module 1B illustrated in this figure differs from the high-frequency module 1A according to Modification 1. Hereinafter, a description of the same configuration of the high-frequency module 1B as that of the high-frequency module 1A according to Modification 1 will be omitted, and different configurations will be mainly described.

As illustrated in FIG. 5, the reception filters 6HR, 6MR, and 6LR are integrated to configure a reception filter module 60R. The reception filter module 60R has a configuration in which the reception filters 6HR, 6MR, and 6LR are formed into one chip, or a configuration in which the reception filters 6HR, 6MR, and 6LR are incorporated in one package.

The semiconductor control IC 40 and the LC filter 61 are arranged above the reception filter module 60R (in the z-axis positive direction). The semiconductor control IC 40 and the reception filter module 60R are stacked in a direction (z-axis direction) perpendicular to the main surface of the mounting substrate 90, and the LC filter 61 (second integrated passive element) and the reception filter module 60R are stacked in a direction (z-axis direction) perpendicular to the main surface of the mounting substrate 90. Further, the transmission filter 6MT and the matching circuit 8MT are stacked in a direction (z-axis direction) perpendicular to the main surface of the mounting substrate 90.

In the high-frequency module 1B according to the present modification, in realizing the stacked structure illustrated in FIG. 5, the reception filter module 60R and the transmission filter 6MT each are connected, via a bump electrode formed on lower surfaces thereof, to the mounting substrate 90. Further, the semiconductor control IC 40 is connected, via a bump electrode formed on the lower surface thereof, to the reception filter module 60R. In addition, the matching circuit 8MT is connected, via a bump electrode formed on the lower surface thereof, to the transmission filter 6MT. Further, the LC filter 61 is connected, via a bump electrode formed on a lower surface thereof, to the reception filter module 60R. Instead of the bump electrode, an electrode formed of, for example, a solder paste may be used.

Further, the semiconductor control IC 40 and the LC filter 61 are each configured to transmit and receive, from the lower surfaces thereof, an electric signal to and from the reception filter module 60R and the mounting substrate 90, and be mechanically bonded to the reception filter module 60R on the lower surfaces thereof, but the present disclosure is not limited thereto. In addition, the matching circuit 8MT is configured to transmit and receive, from the lower surface thereof, an electric signal to and from the matching circuit 6MT and the mounting substrate 90, and be mechanically bonded to the transmission filter 6MT on the lower surface thereof, but the present disclosure is not limited thereto. The semiconductor control IC 40 and the LC filter 61 may be each configured to be mechanically bonded, on the lower surfaces thereof, to the reception filter module 60R via solder, an adhesive, or the like, and an electrode provided on the upper surfaces thereof and the main surface of the mounting substrate 90 may be connected by a bonding wire. Further, the matching circuit 8MT may be configured to be mechanically bonded, on the lower surface thereof, to the transmission filter 6MT via solder, an adhesive, or the like, and an electrode provided on the upper surface thereof and the main surface of the mounting substrate 90 may be connected by a bonding wire.

In the high-frequency module 1B according to the present modification, the semiconductor control IC 40 only needs to be stacked with any one of the reception filters 6HR, 6MR, and 6LR, and the LC filter 61 only needs to be stacked with any one of the reception filters 6HR, 6MR, and 6LR. In addition, at least one of the matching circuits 8HT, 8MT, 8LT, 8HR, 8MR, 8LR, and 80 (first integrated passive element) only needs to be stacked with at least one of the transmission filters 6HT, 6MT, and 6LT.

According to the above configuration, the semiconductor control IC 40 is not stacked with the transmission filter 6MT for transmitting a transmission signal having a larger signal strength than a reception signal, and is stacked with the reception filter module 60R for transmitting the reception signal having a smaller signal strength than the transmission signal. In addition, the matching circuit 8MT formed of the first integrated passive element is stacked with the transmission filter 6MT. Therefore, it is possible to suppress the deterioration of the control characteristics of the semiconductor control IC 40 while reducing the size of the high-frequency module 1B.

Further, the LC filter 61, which is likely to be affected by the high-frequency noise signal oscillated from the transmission filter for transmitting the transmission signal having a larger signal strength than the reception signal, is stacked with the reception filter module 60R instead of the transmission filter 6MT. Therefore, it is possible to suppress the deterioration of the bandpass characteristic of the LC filter 61.

[5 Circuit Element Arrangement Configuration of High-Frequency Module 1C]

Figure 6:
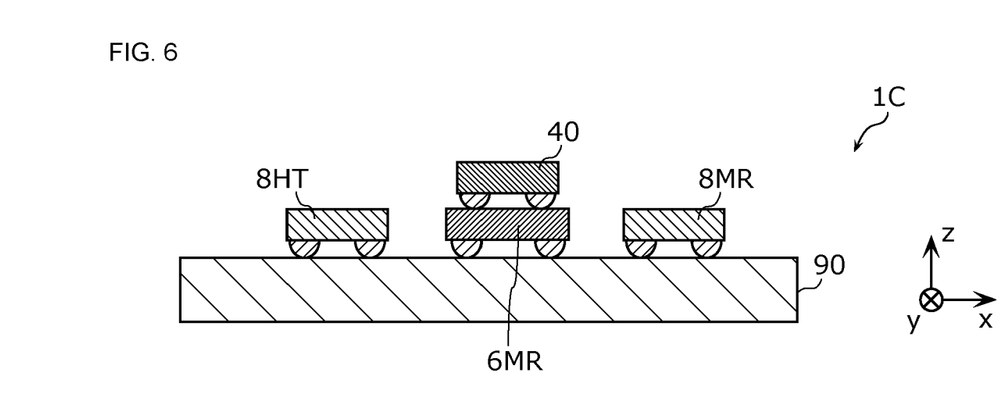
FIG. 6 is a schematic cross-sectional view of a high-frequency module according to Modification 3 of the embodiment.

FIG. 6 is a schematic cross-sectional view of a high-frequency module 1C according to Modification 3 of the embodiment. The high-frequency module 1C illustrated in this figure differs from the high-frequency module 1 according to the embodiment in the arrangement configuration of the transmission filter, the reception filter, the semiconductor control IC, and the matching circuit. Hereinafter, description of the same configuration of the high-frequency module 1C as that of the high-frequency module 1 according to the embodiment will be omitted, and different configurations will be mainly described.

As illustrated in FIG. 6, the semiconductor control IC 40 and the reception filter 6MR (first reception filter) are stacked in a direction (z-axis direction) perpendicular to the main surface of the mounting substrate 90. Further, the matching circuit 8HT (third integrated passive element) and the matching circuit 8MR (fourth integrated passive element) are mounted on the main surface of the mounting substrate 90.

In the high-frequency module 1C according to the present modification, in realizing the stacked structure illustrated in FIG. 6, the reception filter 6MR and the matching circuits 8HT and 8MR are connected, via a bump electrode formed on the lower surfaces thereof, to the mounting substrate 90. Further, the semiconductor control IC 40 is connected, via a bump electrode formed on the lower surface thereof, to the reception filter 6MR. Instead of the bump electrode, an electrode formed of, for example, a solder paste may be used.

Further, the semiconductor control IC 40 is configured to transmit and receive, from the lower surface thereof, an electric signal to and from the reception filter 6MR and the mounting substrate 90, and be mechanically bonded to the reception filter 6MR on the lower surface thereof, but the present disclosure is not limited thereto. The semiconductor control IC 40 may be configured to be mechanically bonded, on the lower surface thereof, to the reception filter module 6MR via solder, an adhesive, or the like, and an electrode provided on the upper surface thereof and the main surface of the mounting substrate 90 may be connected by a bonding wire.

Here, when the mounting substrate 90 is viewed in a plan view, a multilayer body of the semiconductor control IC 40 and the reception filter 6MR is arranged between the matching circuit 8HT (third integrated passive element) and the matching circuit 8MR (fourth integrated passive element).

According to the above-described configuration, since the multilayer body is arranged between the matching circuit 8HT and the matching circuit 8MR, it is possible to suppress electromagnetic field coupling between the matching circuit 8HT and the matching circuit 8MR. Therefore, it is possible to suppress the coupling between a signal path for transmitting the high-frequency signal of the communication band A and a signal path for transmitting the high-frequency signal of the communication band B in a path that is not through the transmission filter 6HT or the reception filter 6MR. Therefore, it is possible to suppress the deterioration of isolation between the high-frequency signals of the different communication bands.

In the high-frequency module 1C according to the present modification, a combination of the third integrated passive element and the fourth integrated passive element mounted on the main surface of the mounting substrate 90 only needs to be any two selected from the matching circuits 8HT, 8MT, 8LT, 8HR, 8MR, 8LR, 80, and LC filter 61.

Further, the semiconductor control IC 40 only needs to be stacked with any one of the reception filters 6HR, 6MR, and 6LR.

[6 Circuit Element Arrangement Configuration of High-Frequency Module 1D]

Figure 7:
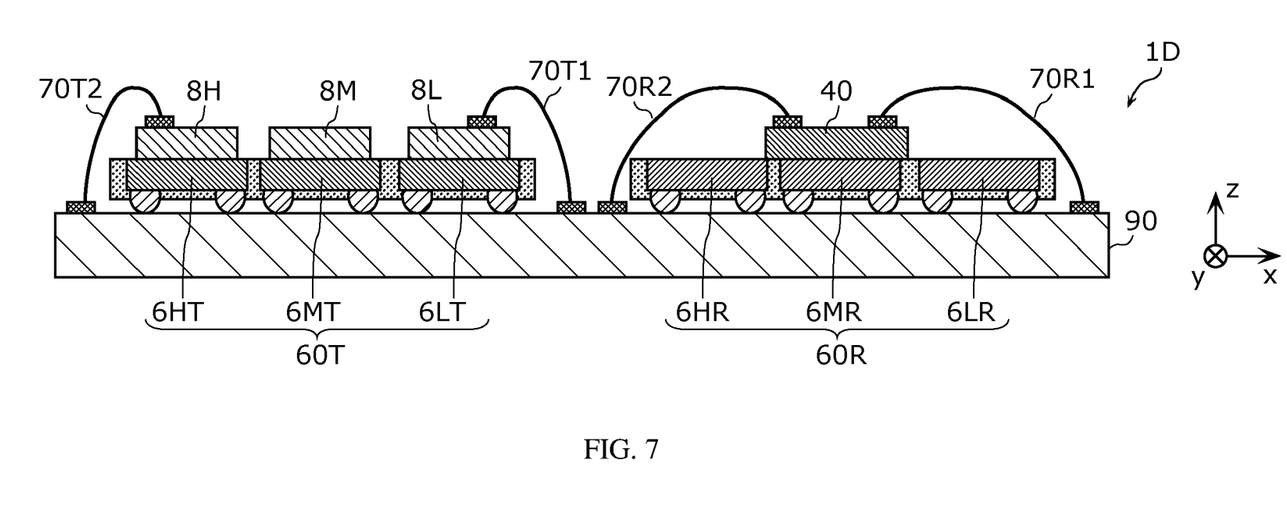
FIG. 7 is a schematic cross-sectional view of a high-frequency module according to Modification 4 of the embodiment.

FIG. 7 is a schematic cross-sectional view of a high-frequency module 1D according to Modification 4 of the embodiment. The high-frequency module 1D illustrated in this figure differs from the high-frequency module 1 according to the embodiment in the arrangement configuration of the transmission filter, the reception filter, the semiconductor control IC, and the matching circuit. Hereinafter, a description of the same configuration of the high-frequency module 1D as that of the high-frequency module 1 according to the embodiment will be omitted, and different configurations will be mainly described.

As illustrated in FIG. 7, the reception filter module 60R and a transmission filter module 60T are mounted on the main surface of the mounting substrate 90. Further, the semiconductor control IC 40 is arranged above the reception filter module 60R (in the z-axis positive direction). In addition, matching circuits 8H, 8M, and 8L are arranged above the transmission filter module 60T (in the z-axis positive direction).

The reception filter module 60R has reception filters 6HR, 6MR, and 6LR. That is, the reception filter module 60R is a reception filter assembly in which a plurality of reception filter elements is integrated, and has a configuration in which the reception filters 6HR, 6MR, and 6LR are formed into one chip, or a configuration in which the reception filters 6HR, 6MR, and 6LR are incorporated in one package.

The transmission filter module 60T has the transmission filters 6HT, 6MT, and 6LT. That is, the transmission filter module 60T is a transmission filter assembly in which a plurality of transmission filter elements is integrated, and has a configuration in which the transmission filters 6HT, 6MT, and 6LT are formed into one chip, or a configuration in which the transmission filters 6HT, 6MT, and 6LT are incorporated in one package.

The matching circuit 8H includes, for example, the matching circuits 8HT and 8HR illustrated in FIG. 1, and is a circuit that establishes impedance matching between the transmission filter 6HT and the power amplifier 7HT and impedance matching between the reception filter 6HR and the low-noise amplifier 7HR.

The matching circuit 8M includes, for example, the matching circuits 8MT and 8MR illustrated in FIG. 1, and is a circuit that establishes impedance matching between the transmission filter 6MT and the power amplifier 7MT and impedance matching between the reception filter 6MR and the low-noise amplifier 7MR.

The matching circuit 8L includes, for example, the matching circuits 8LT and 8LR illustrated in FIG. 1, and is a circuit that establishes impedance matching between the transmission filter 6LT and the power amplifier 7LT and impedance matching between the reception filter 6LR and the low-noise amplifier 7LR.

The matching circuits 8H, 8M, and 8L are each the first integrated passive element (first IPD) in which passive elements, such as an inductor and a capacitor, are integrally mounted inside or the surface of the substrate. The matching circuit 8H includes at least one of the matching circuits 8HT and 8HR. The matching circuit 8M includes at least one of the matching circuits 8MT and 8MR. The matching circuit 8L includes at least one of the matching circuits 8LT and 8LR.

Here, the semiconductor control IC 40 is stacked with the reception filter module 60R (first reception filter), and the matching circuits 8H, 8M, and 8L are stacked with the transmission filter module 60T (transmission filter).

In the high-frequency module 1D according to the present modification, in realizing the stacked structure illustrated in FIG. 7, the reception filter module 60R and the transmission filter module 60T are each connected, via a bump electrode formed on the lower surfaces thereof, to the mounting substrate 90.

The semiconductor control IC 40 has the lower surface bonded to the reception filter module 60R via solder, an adhesive, or the like, and the upper surface connected to the main surface of the mounting substrate 90 by bonding wires 70R1 and 70R2.

The matching circuit 8H has a lower surface bonded to the transmission filter module 60T via solder, an adhesive, or the like, and an upper surface connected to the main surface of the mounting substrate 90 by a bonding wire 70T2. Further, the matching circuit 8L has a lower surface bonded to the transmission filter module 60T via solder, an adhesive, or the like, and an upper surface connected to the main surface of the mounting substrate 90 by a bonding wire 70T1.

Since the semiconductor control IC 40 is connected to the mounting substrate 90 by the bonding wires 70R1 and 70R2, it is possible to suppress the interference of the high-frequency signal transmitted through the reception filter module 60R to the control signal output from the semiconductor control IC 40.

The semiconductor control IC 40 and the matching circuits 8H and 8L may be each configured to be connected, by forming a bump electrode on the lower surfaces thereof, to the reception filter module 60R (or the transmission filter module 60T) and the mounting substrate 90 instead of being connected to the mounting substrate 90 via a bonding wire.

According to the above configuration, the semiconductor control IC 40 is not stacked with the transmission filter module 60T (transmission filter, transmission filter assembly) for transmitting a transmission signal having a larger signal strength than a reception signal, and is stacked with the reception filter module 60R (reception filter, reception filter assembly) for transmitting the reception signal having a smaller signal strength than the transmission signal. Therefore, it is possible to suppress the deterioration of the control characteristics of the semiconductor control IC 40 while reducing the size of the high-frequency module 1D.

In the high-frequency module 1D according to the present modification, the semiconductor control IC 40 and the LC filter 61 (second integrated passive element) may be stacked with the reception filter module 60R (first reception filter), and the matching circuits 8HT, 8MT, 8LT, 8HR, 8MR, 8LR, and 80 (first integrated passive element) may be stacked with the transmission filter module 60T (transmission filter).

This makes it possible to suppress the deterioration of the bandpass characteristic of the LC filter 61.

[7 Circuit Element Arrangement Configuration of High-Frequency Module 1E]

Figure 8:
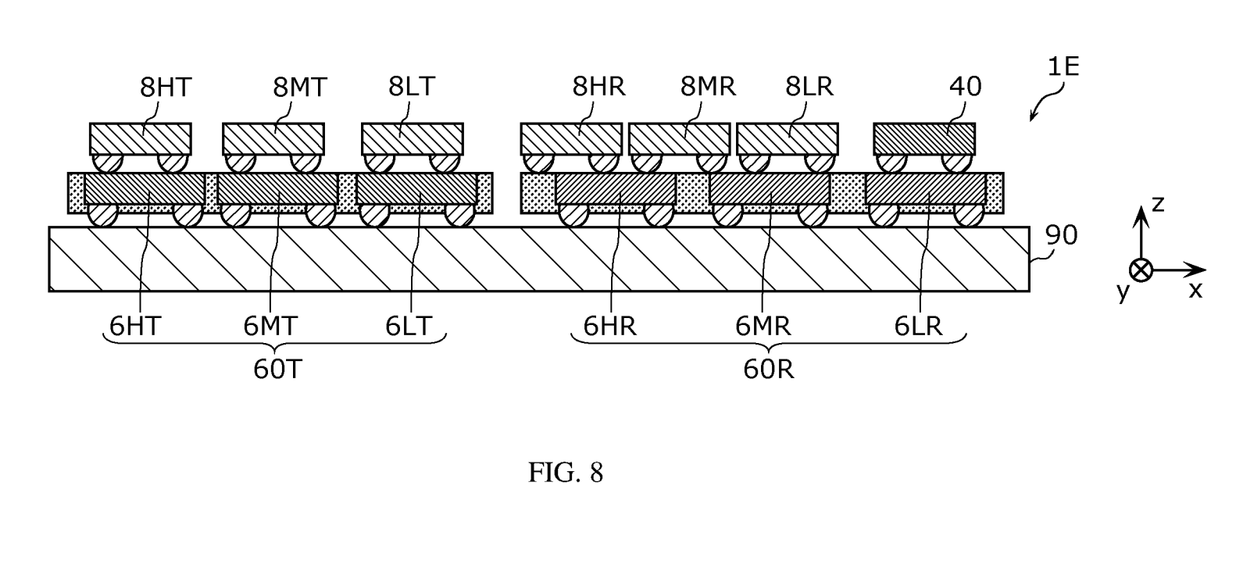
FIG. 8 is a schematic cross-sectional view of a high-frequency module according to Modification 5 of the embodiment.

FIG. 8 is a schematic cross-sectional view of a high-frequency module 1E according to Modification 5 of the embodiment. The high-frequency module 1E illustrated in this figure differs from the high-frequency module 1D according to Modification 4 in the arrangement configuration of the semiconductor control IC and the matching circuit. Hereinafter, description of the same configuration of the high-frequency module 1E as that of the high-frequency module 1D according to Modification 4 will be omitted, and different configurations will be mainly described.

As illustrated in FIG. 8, the semiconductor control IC 40, the matching circuits 8HR, 8MR, and 8LR are arranged above the reception filter module 60R (in the z-axis positive direction). The semiconductor control IC 40 and the reception filter 6LR are stacked in a direction (z-axis direction) perpendicular to the main surface of the mounting substrate 90. In addition, the matching circuits 8HR, 8MR, and 8LR and the reception filters 6HR and 6MR are stacked in a direction (z-axis direction) perpendicular to the main surface of the mounting substrate 90. In addition, the matching circuit 8HT and the transmission filter 6HT are stacked in a direction (z-axis direction) perpendicular to the main surface of the mounting substrate 90. In addition, the matching circuit 8MT and the transmission filter 6MT are stacked in a direction (z-axis direction) perpendicular to the main surface of the mounting substrate 90. In addition, the matching circuit 8LT and the transmission filter 6LT are stacked in a direction (z-axis direction) perpendicular to the main surface of the mounting substrate 90.

The semiconductor control IC 40, and the matching circuits 8HR, 8MR, and 8LR are each connected, via bump electrodes formed on the lower surfaces thereof, to the reception filter module 60R. The semiconductor control IC 40, and the matching circuits 8HR, 8MR, and 8LR may be configured to be mechanically bonded, on the lower surfaces thereof, to the reception filter module 60R via solder, an adhesive, or the like, and an electrode provided on the upper surfaces thereof and the main surface of the mounting substrate 90 may be connected by a bonding wire.

The matching circuits 8HT, 8MT, and 8LT are each connected, via a bump electrode formed on the lower surfaces thereof, to the transmission filter module 60T. The matching circuits 8HT, 8MT, and 8LT may be configured to be mechanically bonded, on the lower surfaces thereof, to the transmission filter module 60T via solder, an adhesive, or the like, and an electrode provided on the upper surfaces thereof and the main surface of the mounting substrate 90 may be connected by a bonding wire.

According to the above configuration, the semiconductor control IC 40 is not stacked with the transmission filter module 60T for transmitting a transmission signal having a larger signal strength than a reception signal, and is stacked with the reception filter module 60R for transmitting the reception signal having a smaller signal strength than the transmission signal. Therefore, it is possible to suppress the deterioration of the control characteristics of the semiconductor control IC 40 while reducing the size of the high-frequency module 1E.

Further, the semiconductor control IC 40 is stacked with the reception filter 6LR from among the reception filters 6HR (second reception filter) and 6MR having the pass band with a relatively high frequency and the reception filter 6LR (first reception filter) having the pass band with a relatively low frequency. According to this configuration, the semiconductor control IC 40 is not stacked with the second reception filter that allows a signal, which easily propagates in space and is likely to be a noise signal (having a high frequency), to pass therethrough, and is stacked with the first reception filter that allows a signal having a low frequency to pass therethrough.

Therefore, it is possible to further suppress the deterioration of the control characteristics of the semiconductor control IC 40 while reducing the size of the high-frequency module 1E.

In the high-frequency module 1E according to the present modification, the semiconductor control IC 40 is configured to be stacked with the reception filter 6LR having a pass band with the lowest frequency among the three reception filters 6HR, 6MR, and 6LR. However, the semiconductor control IC 40 may not be stacked with the reception filter 6HR (second reception filter) having a pass band with the highest frequency out of the three reception filters 6HR, 6MR, and 6LR, and may be stacked with at least one of the reception filters 6MR (third reception filter) and 6LR (first reception filter).

According to the above-described configuration, the semiconductor control IC 40 is not stacked with the second reception filter that allows a signal having the highest frequency to pass therethrough, and is stacked with the first reception filter or the third reception filter each having a pass band with a lower frequency than the pass band of the second reception filter. Therefore, since the semiconductor control IC 40 is not stacked with the second reception filter that allows the signal, which easily propagates in space and is likely to be a noise signal (having a high frequency), to pass therethrough, it is possible to suppress the deterioration of the control characteristics of the semiconductor control IC 40 while reducing the size of the high-frequency module 1E.

In the high-frequency module 1E according to the present modification, the semiconductor control IC 40 and the reception filter 6MR or 6LR only need to be stacked, and the arrangement of the matching circuits 8HT, 8MT, 8LT, 8HR, 8MR, 8LR, and 80 (which are the first integrated passive elements), and the LC filter 61 (second integrated passive element) is not limited. The matching circuits 8HT, 8MT, 8LT, 8HR, 8MR, 8LR, and 80 (which are the first integrated passive elements), and the LC filter 61 (second integrated passive element) may be mounted on the mounting substrate 90, or may be stacked on the transmission filter module 60T or the reception filter module 60R.

[8 Circuit Element Arrangement Configuration of High-Frequency Module 1F]

Figure 9:
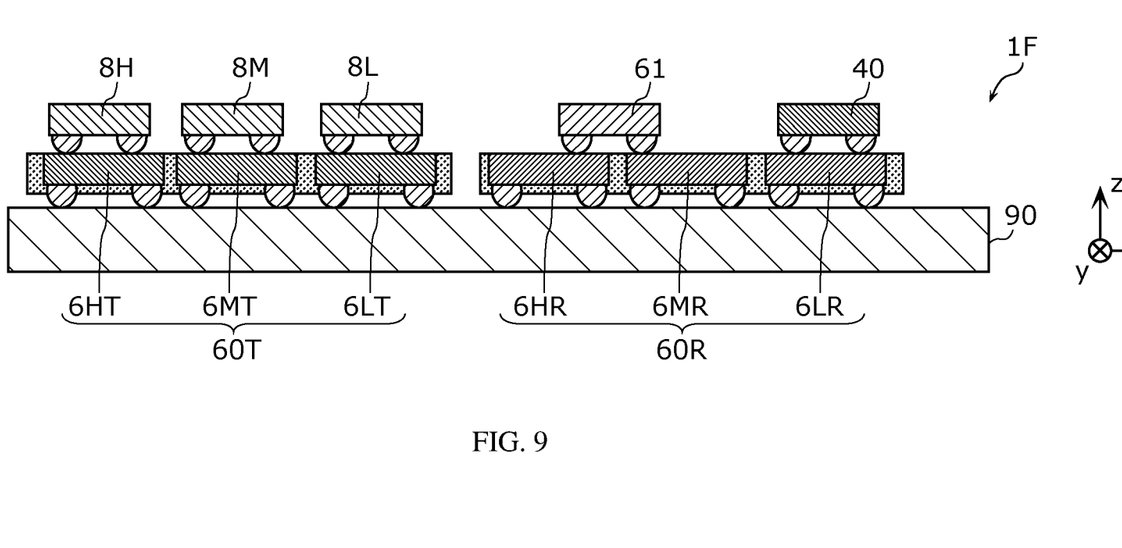
FIG. 9 is a schematic cross-sectional view of a high-frequency module according to Modification 6 of the embodiment.

FIG. 9 is a schematic cross-sectional view of a high-frequency module 1F according to Modification 6 of the embodiment. The high-frequency module 1F illustrated in this figure differs from the high-frequency module 1E according to Modification 5 in the arrangement configuration of the matching circuit and the LC filter. Hereinafter, a description of the same configuration of the high-frequency module 1F as that of the high-frequency module 1E according to Modification 5 will be omitted, and different configurations will be mainly described.

As illustrated in FIG. 9, the semiconductor control IC 40 and the LC filter 61 are arranged above the reception filter module 60R (in the z-axis positive direction). The semiconductor control IC 40 and the reception filter 6LR are stacked in a direction (z-axis direction) perpendicular to the main surface of the mounting substrate 90. Further, the LC filter 61 and the reception filters 6HR and 6MR are stacked in a direction (z-axis direction) perpendicular to the main surface of the mounting substrate 90.

The matching circuits 8H, 8M, and 8L are each the first integrated passive element (first IPD) in which passive elements, such as an inductor and a capacitor, are integrally mounted inside or the surfaces of the substrate. The matching circuit 8H includes at least one of the matching circuits 8HT and 8HR. The matching circuit 8M includes at least one of the matching circuits 8MT and 8MR. The matching circuit 8L includes at least one of the matching circuits 8LT and 8LR.

The matching circuit 8H and the transmission filter 6HT are stacked in a direction (z-axis direction) perpendicular to the main surface of the mounting substrate 90. In addition, the matching circuit 8M and the transmission filter 6MT are stacked in a direction (z-axis direction) perpendicular to the main surface of the mounting substrate 90. In addition, the matching circuit 8L and the transmission filter 6LT are stacked in a direction (z-axis direction) perpendicular to the main surface of the mounting substrate 90.

The semiconductor control IC 40 and the LC filter 61 are each connected, via a bump electrode formed on the lower surfaces thereof, to the reception filter module 60R. The semiconductor control IC 40 and the LC filter 61 may be configured to be mechanically bonded, on the lower surfaces thereof, to the reception filter module 60R via solder, an adhesive, or the like, and an electrode provided on the upper surfaces thereof and the main surface of the mounting substrate 90 may be connected by a bonding wire.

The matching circuits 8H, 8M, and 8L are each connected, via a bump electrode formed on the lower surfaces thereof, to the transmission filter module 60T. The matching circuits 8H, 8M, and 8L may be configured to be mechanically bonded, on the lower surfaces thereof, to the transmission filter module 60T via solder, an adhesive, or the like, and an electrode provided on the upper surfaces thereof and the main surface of the mounting substrate 90 may be connected by a bonding wire.

According to the above configuration, the semiconductor control IC 40 is not stacked with the transmission filter module 60T for transmitting a transmission signal having a larger signal strength than a reception signal, and is stacked with the reception filter module 60R for transmitting the reception signal having a smaller signal strength than the transmission signal. Therefore, it is possible to suppress the deterioration of the control characteristics of the semiconductor control IC 40 while reducing the size of the high-frequency module 1E.

Further, of the reception filters 6HR (second reception filter) and 6MR having a pass band with a relatively high frequency and the reception filter 6LR (first reception filter) having a pass band with a relatively low frequency, the semiconductor control IC 40 is stacked with the reception filter 6LR. According to this configuration, the semiconductor control IC 40 is not stacked with the second reception filter that allows a signal, which easily propagates in space and is likely to be a noise signal (having a high frequency), to pass therethrough, and is stacked with the first reception filter that allows a signal having a low frequency to pass therethrough. Therefore, it is possible to further suppress the deterioration of the control characteristics of the semiconductor control IC 40 while reducing the size of the high-frequency module 1E.

Further, the LC filter 61 (second integrated passive element) is stacked with the reception filter module 60R (first reception filter), and the matching circuits 8H, 8M, and 8L (first integrated passive element) are stacked with the transmission filter module 60T (transmission filter). This makes it possible to suppress the deterioration of the bandpass characteristic of the LC filter 61.

In the high-frequency module 1F according to the present modification, the arrangement of the matching circuits 8H, 8M, 8L, and 80 (which are the first integrated passive elements) is not limited as long as the semiconductor control IC 40 and the reception filter 6MR or 6LR are stacked and the LC filter 61 is stacked with the reception filter module 60R. The matching circuits 8H, 8M, 8L, and 80 (which are the first integrated passive elements) may be mounted on the mounting substrate 90, or may be stacked on the transmission filter module 60T or the reception filter module 60R.

Other Embodiments and the Like

Although the high-frequency module and the communication apparatus according to the present disclosure have been described above with reference to the embodiment and the modifications thereof, the high-frequency module and the communication apparatus according to the present disclosure are not limited to the above-described embodiment and the modifications thereof. Another embodiment achieved by combining arbitrary constituent elements in the above-described embodiments and the modifications thereof, modifications obtained by applying various changes conceived by a person skilled in the art to the above-described embodiment and the modifications thereof without necessarily departing from the spirit of the present disclosure, and various devices incorporating the above-described high-frequency module and the communication apparatus are also included in the present disclosure.

For example, in the high-frequency module and the communication apparatus according to the above-described embodiment and the modifications thereof, another circuit element, wiring, and the like may be inserted between the circuit elements (and the components) and the paths connecting the signal paths disclosed in the drawings.

In addition, in the high-frequency module according to the embodiment and the modifications thereof, a resin member that covers at least part of the circuit elements (and the components) mounted on the mounting substrate 90 may be arranged on the main surface of the mounting substrate 90. The resin member is, for example, a thermosetting epoxy resin, and may further contain an inorganic filler, such as $SiO_2$.

INDUSTRIAL APPLICABILITY

The present disclosure is widely applicable to communication devices, such as mobile phones and the like as a high-frequency module and communication apparatus arranged in a multi-band compatible front-end unit.

REFERENCE SIGNS LIST 1, 1A, 1B, 1C, 1D, 1E, 1F HIGH-FREQUENCY MODULE
2 ANTENNA
3 RF SIGNAL PROCESSING CIRCUIT (RFIC)
4 BASEBAND SIGNAL PROCESSING CIRCUIT (BBIC)
5 COMMUNICATION APPARATUS
6HR, 6LR, 6MR RECEPTION FILTER
6HT, 6LT, 6MT TRANSMISSION FILTER
7HR, 7LR, 7MR LOW-NOISE AMPLIFIER
7HT, 7LT, 7MT POWER AMPLIFIER
8H, 8HR, 8HT, 8L, 8LR, 8LT, 8M, 8MR, 8MT, 80 MATCHING CIRCUIT
10 SWITCH
30 CONTROL CIRCUIT
40 SEMICONDUCTOR CONTROL IC
60H, 60L, 60M DUPLEXER
60R RECEPTION FILTER MODULE
60T TRANSMISSION FILTER MODULE
61 LC FILTER
70R1, 70R2, 70T1, 70T2 BONDING WIRE
90 MOUNTING SUBSTRATE
100 TRANSMISSION/RECEPTION TERMINAL

The invention claimed is:

1. A high-frequency module comprising:
   a mounting substrate;
   a transmission filter on the mounting substrate;
   a first reception filter on the mounting substrate; and
   a semiconductor control integrated circuit (IC) on the mounting substrate,
   wherein the semiconductor control IC is stacked with the first reception filter on the mounting substrate.

2. The high-frequency module according to claim 1, wherein the semiconductor control IC is stacked on top of the first reception filter.

3. The high-frequency module according to claim 1, further comprising:
   a first integrated passive circuit element,
   wherein the first integrated passive circuit element is stacked with the transmission filter on the mounting substrate.

4. The high-frequency module according to claim 3, wherein the first integrated passive circuit element is configured to establish impedance matching between the transmission filter, the first reception filter, and the semiconductor control IC.

5. The high-frequency module according to claim 1, further comprising:
   a second integrated passive circuit element stacked with the transmission filter on the mounting substrate,
   wherein the second integrated passive circuit element comprises an inductor and a capacitor that constitute at least part of an LC filter.

6. The high-frequency module according to claim 1, further comprising:
   a third integrated passive circuit element and a fourth integrated passive circuit element,
   wherein when the mounting substrate is viewed in a plan view, a multilayer body of the first reception filter and the semiconductor control IC are between the third integrated passive circuit element and the fourth integrated passive circuit element.

7. The high-frequency module according to claim 1, wherein the transmission filter comprises a plurality of integrated transmission filter circuit elements, and
   wherein the first reception filter comprises a plurality of integrated reception filter circuit elements.

8. The high-frequency module according to claim 7, further comprising:
   a first integrated passive circuit element; and
   a second integrated passive circuit element,
   wherein the first integrated passive circuit element is configured to establish impedance matching between the transmission filter, the first reception filter, and the semiconductor control IC,
   wherein the second integrated passive circuit element comprises an inductor and a capacitor that constitute at least part of an LC filter,
   wherein the semiconductor control IC and the second integrated passive circuit element are stacked with the reception filter on the mounting substrate, and wherein the first integrated passive circuit element is stacked with the transmission filter on the mounting substrate.

9. The high-frequency module according to claim 1, wherein the semiconductor control IC comprises:
  (1) a switch configured to selectively connect a transmission path for high-frequency signals, and a switch control circuit configured to control the switch; and/or
  (2) an amplifier configured to amplify high-frequency signals, and an amplification control circuit configured to control a gain of the amplifier.

10. The high-frequency module according to claim 9,
  wherein the semiconductor control IC comprises the amplifier and the amplification control circuit, and
  wherein the amplifier is a low-noise amplifier.

11. The high-frequency module according to claim 1, further comprising a second reception filter that is on the mounting substrate and that has a pass band comprising higher frequencies than a pass band of the first reception filter.

12. The high-frequency module according to claim 11, further comprising:
  a third reception filter that is on the mounting substrate and that has a pass band comprising lower frequencies than the pass band of the second reception filter,
  wherein the semiconductor control IC is stacked with at least the first reception filter on the mounting substrate, and is not stacked with the second reception filter on the mounting substrate.

13. The high-frequency module according to claim 12, wherein the semiconductor control IC is stacked with the first filter and the third filter on the mounting substrate, and is not stacked with the second filter on the mounting substrate.

14. A communication apparatus comprising:
  a radio frequency (RF) signal processing circuit configured to process high-frequency signals transmitted and received by an antenna; and
  the high-frequency module according to claim 1, the high-frequency module being configured to pass the high-frequency signals between the antenna and the RF signal processing circuit.

* * * * *